United States Patent
Schmid et al.

(10) Patent No.: US 8,558,223 B2
(45) Date of Patent: Oct. 15, 2013

(54) ORGANIC ELECTRONIC COMPONENT AND METHOD FOR THE PRODUCTION THEREOF

(75) Inventors: Günter Schmid, Hemhofen (DE); Ralf Krause, Erlangen (DE); Andreas Kanitz, Höchstadt (DE); Jürgen Adler, Kleinseebach (DE); Stefan Seidel, Nittendorf (DE); Arvid Hunze, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/121,090

(22) PCT Filed: Sep. 25, 2009

(86) PCT No.: PCT/DE2009/001359
§ 371 (c)(1),
(2), (4) Date: Sep. 8, 2011

(87) PCT Pub. No.: WO2010/034304
PCT Pub. Date: Apr. 1, 2010

(65) Prior Publication Data
US 2011/0309340 A1  Dec. 22, 2011

(30) Foreign Application Priority Data

Sep. 26, 2008  (DE) .................. 10 2008 049 286
Nov. 7, 2008  (DE) .................. 10 2008 056 391

(51) Int. Cl.
*H01L 29/08* (2006.01)
*H01L 35/24* (2006.01)
*H01L 51/00* (2006.01)
*H01L 51/40* (2006.01)

(52) U.S. Cl.
USPC .............. 257/40; 257/E51.002; 438/99

(58) Field of Classification Search
USPC .............. 257/40, E51.002; 438/99
See application file for complete search history.

(56) References Cited

U.S. PATENT DOCUMENTS

| | | | | |
|---|---|---|---|---|
| 4,398,803 A | * | 8/1983 | Pohl et al. | 349/181 |
| 4,771,111 A | * | 9/1988 | Tieke et al. | 525/182 |
| 5,432,014 A | * | 7/1995 | Sano et al. | 428/690 |
| 5,447,662 A | * | 9/1995 | Herr et al. | 252/582 |

(Continued)

FOREIGN PATENT DOCUMENTS

| CN | 1261760 | 8/2000 |
|---|---|---|
| CN | 1700829 | 11/2005 |

(Continued)

OTHER PUBLICATIONS

Cotton, F. A. et al. "Closed-Shell Molecules that Ionize More Readily Than Cesium" Science, vol. 298, Dec. 6, 2002, pp. 1971-1974.

(Continued)

*Primary Examiner* — Ida M Soward
(74) *Attorney, Agent, or Firm* — Cozen O'Connor (57) ABSTRACT

An organic electronic component, including a substrate, a first electrode, a second electrode, an electron-conducting layer which is arranged such that it is electrically conductively connected to at least one of the electrodes, wherein the electron-conducting layer is obtained by joint vaporization of a metal complex with an organic compound.

14 Claims, 5 Drawing Sheets

(56) References Cited

U.S. PATENT DOCUMENTS

| | | | |
|---|---|---|---|
| 5,456,988 A * | 10/1995 | Sano et al. | 428/690 |
| 5,466,392 A * | 11/1995 | Hironaka et al. | 252/301.16 |
| 5,504,183 A * | 4/1996 | Shi et al. | 528/272 |
| 5,529,853 A * | 6/1996 | Hamada et al. | 428/690 |
| 5,616,427 A * | 4/1997 | Tada | 428/690 |
| 5,686,151 A * | 11/1997 | Imai et al. | 427/576 |
| 5,811,833 A * | 9/1998 | Thompson | 257/40 |
| 5,834,894 A * | 11/1998 | Shirasaki et al. | 313/509 |
| 5,837,390 A * | 11/1998 | Kishii et al. | 428/690 |
| 5,858,564 A * | 1/1999 | Tamura et al. | 428/690 |
| 5,876,786 A * | 3/1999 | Zyung et al. | 427/64 |
| 6,025,117 A * | 2/2000 | Nakano et al. | 430/314 |
| 7,005,484 B1 * | 2/2006 | Holmes et al. | 526/75 |
| 7,141,313 B2 | 11/2006 | Seo | |
| 7,485,471 B1 * | 2/2009 | Sun et al. | 436/525 |
| 7,928,652 B2 * | 4/2011 | Kitamura et al. | 313/506 |
| 2002/0064684 A1 | 5/2002 | Seo | |
| 2005/0048422 A1 * | 3/2005 | Nakagawa | 430/502 |
| 2005/0110009 A1 | 5/2005 | Blochwitz-Nimoth et al. | |
| 2006/0011908 A1 | 1/2006 | Ohsawa et al. | |
| 2006/0036114 A1 * | 2/2006 | Wang et al. | 568/1 |
| 2006/0115536 A1 * | 6/2006 | Yacaman et al. | 424/489 |
| 2007/0013300 A1 * | 1/2007 | Takahashi et al. | 313/506 |
| 2007/0060736 A1 | 3/2007 | Becker et al. | |
| 2008/0258610 A1 * | 10/2008 | Ikeda et al. | 313/504 |
| 2010/0047828 A1 * | 2/2010 | Sorensen et al. | 435/7.72 |
| 2010/0157585 A1 * | 6/2010 | Diekmann et al. | 362/228 |
| 2011/0068290 A1 * | 3/2011 | Haddon et al. | 252/62.51 R |
| 2011/0130485 A1 * | 6/2011 | Mizori et al. | 522/167 |
| 2011/0269178 A1 * | 11/2011 | Yenugonda et al. | 435/34 |

FOREIGN PATENT DOCUMENTS

| | | |
|---|---|---|
| CN | 1914747 | 2/2007 |
| DE | 699 12 968 | 4/2004 |
| DE | 103 37 346 | 3/2005 |
| DE | 698 33 385 | 9/2006 |
| DE | 60 2004 008 472 | 5/2008 |
| EP | 1 011 155 | 6/2000 |
| EP | 1 04 4586 | 10/2000 |
| EP | 1 115 808 | 7/2001 |
| EP | 1 64 7062 | 4/2006 |
| EP | 1 672 714 | 6/2006 |
| EP | 1 923 448 | 5/2007 |
| JP | 2005-056757 | 3/2005 |
| JP | 2005-072012 | 3/2005 |
| JP | 2007-027587 | 2/2007 |
| JP | 2007-526640 | 9/2007 |
| WO | WO 2004/015746 | 2/2004 |
| WO | WO 2005/014689 | 2/2005 |
| WO | WO 2005/086251 | 9/2005 |
| WO | WO 2007/054345 | 5/2007 |

OTHER PUBLICATIONS

Cotton, F.A. et al. "Multiple Bonds Between Metal Atoms" Springer Science and Business Medial, vol. 3, 2005, pp: content, 1-21, 35-57, 189-191, 762-771, 804.

Cotton, F.A. et al. "Studies of Tetrakis(trifluoroacetate) Dirhodium. 2. † APi Complex of Hexamethylbenzene with Tetrakis(trifluoroacetate) Dirhodium(II, II)" American Chemical Society, 1999, vol. 18, pp. 2724-2726.

Cotton, F. A. et al. "Supramolecular Assemblies of Dimetal Complexes with Polydentate N-Donor Ligands: from a Discrete Pyramid to a 3D Channel Network" Inorganic Chemistry, vol. 41, No. 11, 2002, pp. 2903-2908.

Cotton, F. A. et al. "Synthesis and Reactivity of a Very Strong Reducing Agent Containing a Quadruple Bond: Structures of W2(hpp)4 and W2(hpp)4Cl2" Inorganic Chemistry Communications, vol. 6, 2003, pp. 121-126.

* cited by examiner

ORGANIC ELECTRONIC COMPONENT AND METHOD FOR THE PRODUCTION THEREOF

RELATED APPLICATIONS

This is a U.S. national stage of application No. PCT/DE2009/001359, filed on Sep. 25, 2009.

This application claims the priorities of the German applications 10 2008 049 286.8 filed Sep. 26, 2008 and 10 2008 056 391.9 filed Nov. 7, 2008, the entire content of both of which are hereby included by reference.

FIELD OF THE INVENTION

An organic electronic component comprising a substrate, a first electrode, a second electrode, an electron-conducting layer which is arranged in such a way that it is electrically conductively connected to at least one of the electrodes, wherein the electron-conducting layer can obtained by joint vaporization of a metal complex, which comprises a central metal atom, with an organic compound.

A common problem in organic electronic components is to provide a layer which has a very high degree of electron conductivity. The electron conductivity in the component is often the decisive variable for the efficiency and serviceable life of the component. In the case of an organic LED (OLED), the recombination of electrons and holes serves to form excitons which can excite substances to emit radiation. In these components, the luminescence also depends directly upon the exciton density which in turn depends upon the recombination of electrons and holes. In some components, purely crystalline layers are used for transportation of electrons. These purely crystalline layers have the disadvantage that they comprise regions of different conductivity. As a consequence, the charge carriers always select the path of least resistance. Therefore, a non-uniform electron flow is obtained in this layer. At the locations where a considerably increased electron flow occurs, the layer can become overheated and thus damaged. In the case of electroluminescent components, this irregular electron flow also leads to inhomogeneous emission. In the regions where a higher electron flow occurs and more excitons are formed, the component emits more radiation and is thus brighter than in the regions where a lower electron flow is present.

SUMMARY OF THE INVENTION

One object of the present invention is to provide an electron-conducting layer in an organic electronic component and the electron-conducting layer having a high degree of electron conductivity.

An embodiment of the organic electronic component comprises a substrate, a first electrode, a second electrode and an electron-conducting layer which is arranged in a way such that it is electrically conductively connected to at least one of the electrodes, wherein the electron-conducting layer is obtained by joint vaporization of a metal complex with an organic compound.

By virtue of the joint vaporization of the metal complex with an organic compound, these two compounds interact with one another in the gas phase or when they meet one another on the substrate surface. This interaction causes the compounds to be mutually coordinated. The compounds are deposited in the coordinated state, so that a layer is formed, in which a short-range order is provided. The term short-range order is understood to mean that not the entire layer per se is crystalline but the organic compounds are disposed around the metal complex in its immediate environment in accordance with a specific pattern which depends upon the selected metal complex and the organic compound. However, the entire layer per se is amorphous and thus does not have any long-range order. By virtue of the coordination of the organic compound on the metal complexes, and the associated overlap of the orbitals, additional electrons can be transferred from the metal to the ligand via a metal complex-ligand-electron transfer (metal-ligand-charge-transfer complex). These electrons can be available for electron transportation in the organic electronic component. By increasing the "free" electrons, the electron conductivity in the component is significantly improved. This leads to an increase in efficiency and serviceable life of the organic electronic component.

In an embodiment of the organic electronic component, the organic compound coordinates to the metal atom.

The coordination of the organic compound to the central atom can be effected directly via a further atom or else also via an aromatic system. During or after coordination of the organic compound, preferably none of the previously present ligands of the metal complex is separated, thus, no ligand exchange takes place. So, the metal complex is able to accept further additional ligands and thus comprises at the central atom free coordination sites which can be occupied by further ligands.

In this regard, reference is made to a document by F. A. Cotton (F. A. Cotton et al., Organometallics, 1999, 18, 2724-2726). In the publication by Cotton, it is shown how an aromatic compound, in this case a sixfold methylated benzene ring, coordinates to a rhodium complex. It is described that the coordination of the aromatic system can lead to a chain formation, wherein two metal complexes are linked by an organic compound. In this case, the aromatic compound is positioned perpendicularly or almost perpendicularly between adjacent, bridged metal complexes.

In a further embodiment of the organic electronic component, the metal complex comprises more than one central atom.

The presence of more than one central atom improves the possibility that several organic compounds will coordinate simultaneously to the metal complex. Preferably, the metal complex comprises two central metal atoms. In this case, each of the two central atoms has a coordination site without a steric hindrance being generated. In this case, the two central atoms of the metal complex may or may not interact with one another. Metal complexes having two central atoms are particularly well suited for the formation of chains. In this regard, reference is made once again to the publication by Cotton in Organometallics. Herein, the chain formation of a metal complex with two central rhodium atoms is observed. A chain-like sequence of metal complexes and of aromatic compounds bridging two adjacent complexes is illustrated. The aromatic compound is positioned perpendicularly between the metal complexes and the Rh—Rh axis is positioned perpendicularly on the aromatic compound. In an embodiment in accordance with the invention, metal complexes having two central atoms, which do not have any ligands in the extension of the central atom axis yet, are preferred, so that the central atom still comprises two free, preferably opposite coordination sites. This is the case, for example, for the rhodium complex in the publication by Cotton. For such metal complexes, it is, for steric reasons, particularly easy to coordinate to additional ligands to both opposite sides in the extension of the central atom axis.

In an embodiment of the organic electronic component, the central atom or central atoms is/are selected from: Cr, Mo or W.

In this case, W is a preferred central metal atom. It is particularly preferred if all of the central atoms in the metal complex are W. The elements Cr, Mo and W prove to be particularly advantageous for two reasons. On the one hand, they have the ability to coordinate with additional ligands and on the other hand, with a suitable selection of the ligands, their metal complexes have a very low ionization enthalpy. This means that these metal complexes have a high disposition and ability to provide "free" electrons. These electrons can be transferred for example to the additionally bonded ligands. By virtue of this coordination and the associated metal complex-ligand-electron transfer (charge-transfer-complex), the electron-conducting layer can be provided with additional electrons for charge transport. By virtue of these electrons, the charge transport can be increased in the organic electronic component, which increases the efficiency of the component. In this regard, reference is made to a publication by F. A. Cotton (F. A. Cotton et al., Science, Vol. 298, 2002, page 1971-1974). In this publication by Cotton, a $W_2(TBD-A)_4$ complex is observed, as shown schematically in the following Figure:

In his publication, Cotton shows that this complex belongs to the compounds whose electron configuration comprises closed, i.e. filled, electron shells and still has an extremely low ionization potential. Cotton also shows that the central atoms in this complex can have very high oxidation numbers. Therefore, many electrons can be donated by the two central W-atoms.

In a further publication by Cotton (F. A. Cotton et al., Inorganic Chemistry Communications, Vol. 6, 2003, pages 121-126), Cotton shows a synthesis path for the $W_2(TBD-A)_4$ complex.

In a further embodiment of the organic electronic component, the organic compound comprises a heteroaromatic compound.

Preferably, the organic compound comprises more than one heteroaromatic compound. This enables the organic compound to coordinate to several metal complexes simultaneously. In contrast to an aromatic compound, a heteroaromatic compound has the advantage that it is not only able to coordinate to a metal complex via the aromatic system (π-electrons), as described in the publication by Cotton in Organometallics which is cited above, but furthermore the coordination can also be effected directly via the heteroatom. The greater the number of heteroaromatic compounds in the organic compound, the greater the number of possible coordination sites for a metal complex. Here, N is a preferred heteroatom. Due to the mostly free electron pair, N has very good coordination properties with respect to metal complexes.

In a further embodiment of the organic electronic component, the organic compound comprises a heteroaromatic compound which is conjugated with an aromatic compound via a C—C bond.

A C—C bond is understood to be a carbon-carbon single bond; the heteroaromatic compound and the aromatic aromatic compound are thus not condensed. In contrast to the condensed systems, a system of this type, in which the heteroaromatic compound is linked with further aromatic compounds via C—C single bonds, has the advantage that it is not so sterically demanding and voluminous, and therefore can coordinate more easily to a metal complex or can coordinate better to several metal complexes simultaneously. The heteroatom in the heteroaromatic compound is preferably N, O or S, wherein N is particularly preferred.

In a further embodiment of the organic electronic component, the organic compound comprises only heteroaromatic compounds which do not form any condensed systems. Therefore, the heteroaromatic compounds are not condensed with other heteroaromatic or aromatic systems. In this case, the sterical advantage of the non-condensed systems over the condensed systems is also apparent. The heteroatom in the heteroaromatic compound is preferably N, O or S, wherein N is particularly preferred.

In a further embodiment of the organic electronic component, the organic compound comprises only heteroaromatic compounds having one or two heteroatoms. A heteroaromatic compound is understood to be an entire condensed system. The heteroatom or heteroatoms in the heteroaromatic compound is/are preferably N, O or S, wherein N is particularly preferred.

In a further embodiment of the organic electronic component, the organic compound comprises only heteroaromatic compounds whose rings are formed from six atoms. By way of these heteroaromatic compounds in conjugation with other heteroaromatic or aromatic compounds, it is possible in the most effective manner to form a delocalized π-electron system which is able to accept additional charges very easily. The heteroatom in the heteroaromatic is preferably N, O or S, wherein N is particularly preferred.

In a further embodiment of the organic electronic component, the organic compound comprises the general formula:

wherein
the ring members A to F independently of each other represent C or one or two ring members can be N,
n is 2 to 8, where the free valences of the ends can be in each case independently of each other saturated by H, methyl, phenyl, 2-pyridyl, 3-pyridyl or 4-pyridyl,
$R^1$ to $R^4$ can be in each case independently of each other H, methyl, phenyl, 2-pyridyl, 3-pyridyl or 4-pyridyl and/or $R^1$ and $R^2$ or $R^3$ and $R^4$ can be connected together by butadiene or azabutadiene units, so that a six-membered ring is formed, and can be connected between the nth and (n+1)th ring by ethylene or azomethine units, whereupon phenanthrene or aza-phenanthrene units are formed.

Compounds with this general formula can coordinate to metal complexes. Furthermore, compounds of this general formula are suitable for adjusting the color impression of the organic electronic component in the switched-off state.

By means of a suitable selection of the metal complex and the organic compound, a predetermined color impression for the desired external appearance can be ensured at least in the switched-off electronic operating state. This can be possible by the formation of charge-transfer complexes in the electron-conducting layer. The metal complexes and the organic compounds form electron-donor-acceptor complexes whose absorption bands are preferably in the visible wavelength range. The absorption band of the charge-transfer complexes depends upon the respective energetic level of its HOMOs and LUMOs relative to each other. The charge-transfer complexes can thus enable a predetermined color impression.

In addition, these compounds exhibit good charge-transporting properties which can be controlled by the number of nitrogen atoms in the ring system.

The absorption band of the complexes formed by co-condensation specifically influences the resulting color impression of the component in the switched-off state. The oligopyridyl and/or -pyrimidyl arenes can be freely permuted in their arrangement and may again carry in their periphery phenyl, pyridyl and pyrimidyl as well as hydrogen and methyl as substituents. Oligo is intended to mean a value range of n=2 to 8.

In a further embodiment of the organic electronic component, the organic compound is selected from:

I

II

III

IV

V

VI

VII

VIII

IX

X

XI

XII

XIII

The compounds illustrated in the structures I to XIII are particularly well suited as an organic compound for the electron-conducting layer. Each of these compounds comprises both an aromatic compound and also a nitrogen heterocycle. Each of these compounds thus comprises several coordination sites for metal complexes. These compounds I to XIII allow not only for the formation of two-dimensional chains, but, by virtue of their multiplicity of coordination sites, they also allow for the formation of three-dimensional networks. In this case, an organic compound coordinates to more than two metal complexes. Furthermore, these compounds have large delocalized electron systems, such as for example condensed aromatic compounds or aromatic compounds which are in electronic conjugation with each other. These delocalized electron systems enable the compounds to accept and transport further negative charges very effectively since this additional charge can be easily distributed onto several atoms in the molecule. Therefore, a coordinated metal complex can effectively transfer a negative charge to the organic compound coordinated thereto. Furthermore, electrons of the organic compounds I to XIII can also be transferred effectively amongst the organic compounds themselves. This is also crucial for good electron conductivity in the electron-conducting layer.

In a further embodiment of the organic electronic component, the organic compound is selected from:

XIV

XV

XVI

The compounds illustrated in the structures I, II, XIV to XXIII are particularly well suited as an organic compound for the electron-conducting layer. Each of these compounds comprises a nitrogen heterocycle and in addition a further nitrogen heterocycle or a homoaromatic compound which is formed from C-atoms. Each of these compounds thus has several coordination sites for metal complexes. These compounds I, II, XIV to XXIII allow not only for the formation of two-dimensional chains, but, by virtue of their multiplicity of coordination sites, they also allow for the formation of three-dimensional networks. In this case, the organic compound coordinates to more than two metal complexes. Furthermore, these compounds have large delocalized electron systems, such as for example condensed aromatic compounds or aromatic compounds which are in electronic conjugation with each other. These delocalized electron systems enable the compounds to accept and transport further negative charges very effectively since this additional charge can be distributed easily onto several atoms in the molecule. Therefore, a coordinated metal complex can effectively transfer a negative charge to the organic compound coordinated thereto. Furthermore, electrons of the organic compounds I, II, XIV to XXIII can also be transferred effectively amongst the organic compounds themselves. This is also crucial for good electron conductivity in the electron-conducting layer.

In an embodiment of the organic electronic component, at least parts of the organic compounds bridge two metal complexes together, so that a chain-like structure is formed and/or at least parts of the organic compounds bridge more than two metal complexes together, so that a network-like structure is formed.

By suitable selection of the metal complexes, for example binuclear metal complexes, and suitable selection of the organic compounds such as for example the compounds I to XXIII, the joint vaporization of the metal complex with the organic compound in the gas phase or on the deposited surface results in interactions, so that the compounds coordinate to each other. The coordination is also retained when forming the electron-conducting layer. This coordination can result in the formation of two-dimensional chains or three-dimensional networks. These chains or networks are deposited as such in the vaporization process and are also present as such in the electron-conducting layer in the organic electronic component. The formation of chain-like or network-like structures enables additional electrons to be able to be transferred from the metal complexes to the organic compounds, said electrons are then available for charge transport in the electron-conducting layer. In this regard, reference is made to a publication by F. A. Cotton (F. A. Cotton et al., Inorganic Chemistry, Vol. 41, No. 11, 2002, page 2903-2908). In this publication, it is inter alia shown on a metal complex having two central rhodium atoms and a silicon-organic compound how chain-like structures can be formed by multiple coordination of several metal complexes to an organic compound. In a further example in the publication by Cotton, the example of a tri-pyridine methanol (HO—C—$(C_5H_4N)_3$) is used to demonstrate that the pyridine can coordinate to two metal complexes simultaneously via the nitrogen heteroatom and the aromatic system. The two further pyridine substituents of the molecule can likewise coordinate to further metal complexes. This example demonstrates clearly that, by means of a suitable selection of the organic compound, it is possible to coordinate to several metal complexes simultaneously. By means of the corresponding selection of the metal complexes, more than one organic compound can coordinate to a metal complex, whereby chain-like and/or network-like structures are formed in the electron-conducting layer.

In an embodiment of the organic electronic component, the electron-conducting layer is amorphous and comprises a microcrystalline to nanocrystalline short-range structure.

If one deposits organic compounds, as used for example for electron-conducting layers, by vaporization, crystallization of the organic compounds may then occur. A purely crystalline electron-conducting layer has proven to be disadvantageous, since this layer comprises regions of different conductivity. The application of a voltage thus results in different current densities in the layer. In regions having very high current densities, the electron-conducting layer can overheat and become damaged. In the case of light-emitting components, the different conductivity would additionally result in inhomogeneous emission. The problem is mitigated by a macroscopically to nanoscopically amorphous electron-conducting layer. Such a layer can be obtained by the joint vaporization of the organic compound with a metal complex, whereupon the organic compound coordinates to the metal complex and thereby prevents crystallization. However, the metal complex must be used to ensure that the now macroscopically to nanoscopically amorphous structure still has effective electron-conducting properties. This can be effected, for example, by virtue of the fact that the additional compound provides additional charge carriers. An organic compound which coordinates to the metal complex and thus forms microcrystalline structures is able to accept additional charge carriers which are provided by the central atom. Therefore, the mobility of the charge carriers which is reduced in comparison with the crystalline layer is compensated by increasing the number of charge carriers. An organic electronic component, for example an OLED which comprises this type of layer, gives homogeneous light. At the grain boundaries of OLED devices, which comprise macrocrystalline layers, the conductivities change such that inhomogeneous light impressions are obtained or for example an LED is destroyed by over-current at certain locations.

In an embodiment of the organic electronic component, the electron-conducting layer does not comprise any radiation-emitting substances.

Therefore, in the case of this embodiment, no radiation can be emitted from the electron-conducting layer. In this embodiment, neither the organic compound nor the metal complex are able to emit radiation.

An embodiment of the organic electronic component comprises a metal complex whose HOMO (highest occupied molecular orbital) is closer to its ionization energy than the LUMO (lowest unoccupied molecular orbital) of the organic compound which additionally coordinates to the metal complex.

This enables even the metal complexes having a closed electron structure to transfer electrons from the complex to the ligand via complex-ligand-charge transfer. These transferred electrons make a significant contribution to the electron conductivity of the electron-conducting layer. In this regard, reference is made once again to the publication by Cotton in Science which has already been discussed in a previous paragraph. In this publication, Cotton describes the extremely low ionization enthalpy of complexes of the general formula $M_2(TBD-A)_4$, wherein, in the publication, the central atom M is selected from Cr, Mo or W. TED-A stands for the anion of 1,5,7-triazabicyclo[4.4.0]dec-5-ene. In his publication, Cotton provides a more detailed analysis of the orbitals of the metal complex and of the TED-A ligand. He shows that, inter alia, the level of the HOMO of the metal complex relative to the LUMO of the TBD-A ligand accounts for the low ionization enthalpy.

The organic electronic component is preferably formed as an organic LED (OLED) which comprises an electroluminescent layer. However, the organic electronic component can also be for example an organic field effect transistor, an organic solar cell or an organic photodetector. An organic field effect transistor (OFET) comprises three terminals: source, gate and drain. Here, the substrate can be used as a gate electrode. If this is the case, the substrate is then followed by an insulator layer, on which the source and drain terminals are arranged. An organic semiconductor layer is arranged both between the source and drain and also over the two of the terminals. In the case of the organic solar cell, two electrodes are arranged one above the other on a substrate and an organic, photo-active layer is located in between said electrodes. The photo-active layer absorbs the light, which leads to charge separation in the layer. The electrons formed this way migrate to the anode and the holes migrate to the cathode, thus generating a current flow.

The electron-conducting layer is particularly well suited for organic electronic components whose efficiency depends inter alia upon a good electron transport. For example in an OLED, the luminescence depends directly on the number of excitons formed. This, in turn, depends on how many electrons and holes recombine. An effective electron and hole transport thus leads to a high recombination rate and thus to good luminescence and efficiency of the OLED.

In addition to the organic electronic component itself, methods for manufacturing the organic electronic component are also claimed.

One variant of the method for manufacturing an organic electronic component comprises the method steps: providing a substrate as method step A), applying a first electrode in method step B), depositing an electron-conducting layer on the substrate as method step C), applying a second electrode in method step D), wherein the electron-conducting layer is deposited by simultaneous vaporization of a metal complex and an organic compound.

For example, an organic electronic component as claimed in claim 1 can be manufactured with such a method. The electron-conducting layer can be deposited directly onto a substrate or other layers, such as for example an electrode layer, can be deposited beforehand on the substrate, so that the electron-conducting layer is then deposited onto the layers which are already arranged on the substrate. Deposition of the electron-conducting layer can be effected by means of simultaneous vaporization of a metal complex and an organic compound. The simultaneous vaporization enables the molecules to interact with each other.

In a further method variant, the organic compound coordinates to the metal complex due to the joint vaporization.

Because of the simultaneous vaporization of metal complexes and organic compounds, both compounds are simultaneously present next to each other in the gas phase. This enables the organic compound to coordinate to the metal complex in the gas phase. The coordination can be effected for example via a heteroaromatic compound in the organic compound. The coordination is also retained during the deposition of the electron-conducting layer.

However, there is also the possibility that the metal complex and the organic compound meet each other first on the surface to be coated or when they impinge on the surface and the organic compound coordinates to the metal complex, whereupon electron-conducting layer is formed.

In a further method variant, the electron-conducting layer is deposited as a chain-like or network-like structure.

Because of the coordination of the organic compound to the metal complex in the gas phase, chain-like or network-like structures can be formed. These chain-like or network-like structures are then also deposited as such and are also present as such in the electron-conducting layer in the organic electronic component.

When the molecules impinge on the surface, they are still flexible to such an extent that the coordination sites meet each other and the corresponding energy is released, which means that coordination can occur.

In one method variant, the degree of cross-linking of the electron-conducting layer is controlled by the ratio between the metal complex and the organic compound during vaporization.

The degree of cross-linking and thus the formation of network-like or chain-like structures can be controlled by the ratio of metal complex to organic compound.

Alternatively, referring to the molar ratio, the organic compound is vaporized in an excess compared to the metal complex.

In this case, the proportion of the metal complex in the layer which comprises the metal complex and the organic compound can be 1 to 50 mol %, a proportion of 5 to 25 mol % is preferred, a proportion of 10 to 15 mol % is particularly preferred.

In a further method variant, the organic compound does not coordinate to the metal complex prior to vaporization.

The metal complex and the organic compound can for example be vaporized from two different vessels which are spatially separated from each other. However, it is also possible to put the two compounds into one vessel without a reaction or coordination taking place amongst the compounds in the solid phase and so that the compounds then being vaporized from the joint vessel.

In the following, a variant of a manufacturing method shall be exemplarily described in more detail by means of an example.

In a vacuum recipient, an electrically heatable silica or ceramic crucible is charged with 200 mg of $W_2(TBD-A)_4$. A further silica or ceramic crucible is charged with the organic compound of above-mentioned structure I. A glass plate 60 mm×60 mm having a structured ITO-electrode (indium tin oxide) is attached to a substrate holder approximately 25 cm away from the crucibles. The substrate mask is closed and the two sources are regulated to a deposition rate of 4.5 nm/s. The molar ratio of the metal complex to the organic compound during vaporization was 1 to 9. An electron-conducting layer having a layer thickness of 150 nm is deposited. The electron-conducting layer has a three-dimensional network of the metal complex $W_2(TBD-A)_4$ and the organic compound I. The organic electronic component is completed with a 150 nm thick aluminum electrode.

In a further variant of the previously described method for manufacturing an organic electronic component which is an OLED, a 10 nm thick layer of the organic compound of the above-mentioned structure I is vapor-deposited before the electron-conducting layer. Due to the small layer thickness, crystallization of the organic compound does not occur in this case. The previously vapor-deposited layer of organic compound I reduces the emission extinction by the $W_2(TBD-A)_4$ complex. This means that the fraction of radiation which is absorbed in the component is reduced.

In a further method variant, the organic compound of the above-mentioned structure II is used instead of the organic compound of the above-mentioned structure I.

In the following, Variants of the invention are explained in more detail using Figures and exemplary embodiments, in which.

BRIEF DESCRIPTION OF THE DRAWINGS

DETAILED DESCRIPTION OF THE DRAWINGS

Figure 1:
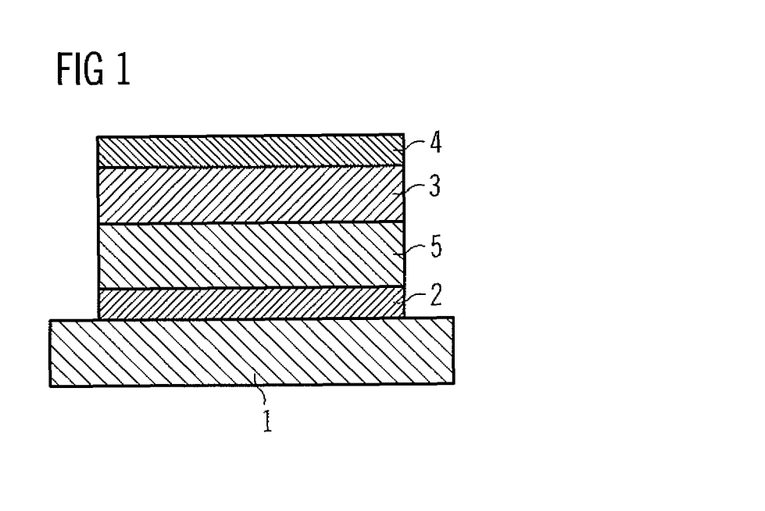
FIG. 1 shows a schematic side view of an embodiment which is formed as an OLED and comprises a separate emitting layer.

FIG. 1 shows a layer sequence comprising a substrate 1, on which a first electrode 2 and a second electrode 4 are arranged. The electron-conducting layer 3 and the emitting layer 5 are located between the two electrodes. By applying a voltage to the electrodes, electrons are injected by one of the two electrodes, the cathode, into the layers 3 and 5 and holes are injected by the other electrode. Excitons can be formed by the recombination of the electrons and holes. In the embodiment illustrated in FIG. 1, the radiation is emitted from the emitting layer 5. Located in this layer are the substances which can be excited to emission by excitons. The substances can be for example phosphorescent or fluorescent substances.

Figure 2:
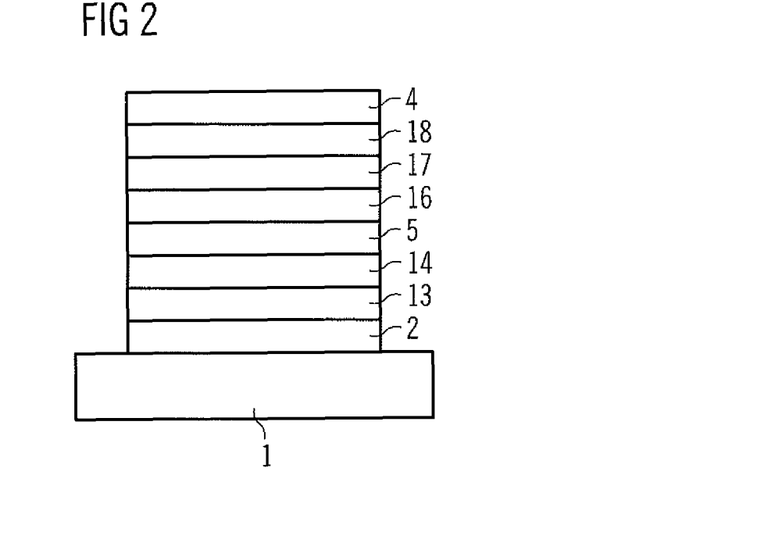
FIG. 2 shows a schematic side view of an embodiment which is formed as an OLED and comprises nine layers.

FIG. 2 shows an embodiment of the component which is formed as an OLED. In the figure, a schematic side view of a layer stack of nine layers is illustrated. A first electrode 2, which is for example transparent and of ITO (indium tin oxide), is arranged on a substrate 1, which is made for example of glass. Arranged on this electrode 2 is a hole-injecting layer 13, which in turn has a hole-transporting layer 14 arranged thereon. Located on the hole-transporting layer 14 is an organic active layer, the organic emitting layer 5, on which in turn is arranged a hole-blocking layer 16 which is followed by an electron-transporting layer 17, on which an electron-injecting layer 18 is arranged. A second electrode 4, for example a metal electrode, is located on the electron-injecting layer 18.

When a voltage is applied between the first and the second electrode layer 2, 4, current flows through the component, and, in the emitting layer 5, radiation is emitted which, for example in the form of visible light, can be coupled out of the component for example via the first electrode layer 2 and the substrate 1. Alternatively, the second electrode layer 4 can also be formed additionally or solely in a transparent manner and the light can leave the component through both electrode layers or only through the second electrode layer 4.

The electron-conducting layer in accordance with the present invention may here be any layer, in which electrons are transported. Preferably, the electron-conducting layer in accordance with the invention is the electron-transporting layer 17 or the electron-injecting layer 18. By virtue of the improved electron transport, more electrons and holes can recombine, as a result of which more excitons are formed. Because of the increased number of excitons, the emission and thus the luminous efficiency are increased.

The electron-conducting layer 3 in accordance with the present invention may here also be a charge carrier generation layer (not shown in the Figure). This charge carrier generation layer can adjoin to a hole-transporting layer with or without an intermediate layer. A charge carrier generation layer renders it possible, for example, to stack different OLEDs together. For this purpose, the charge carrier generation layer, arranged as an intermediate layer between two OLED stacks, can be provided with a further voltage supply. In particular, this can mean that the inter-mediate layer can be adjusted in such a way that the two OLED stacks can be energized with different voltage potentials.

Figure 3:
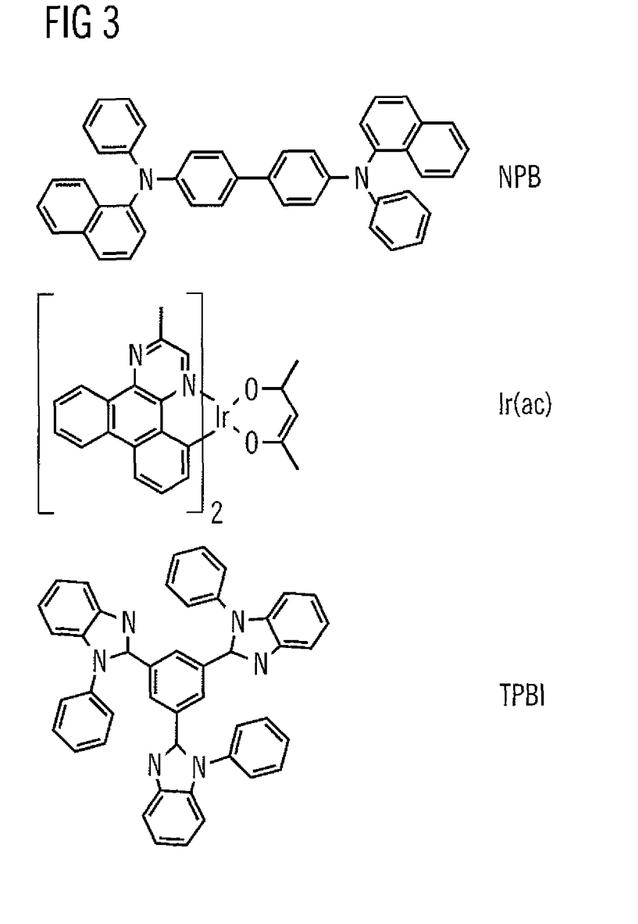
FIG. 3 shows the structure formulae of three chemical compounds which are used in an OLED.

FIG. 3 shows the structure of three organic compounds, as can be employed for example in an OLED. The first structural formula shows NPB (N,N'-di(naphthyl-1-yl)-N-N'-diphenyl-benzidine) which is suitable for example as a hole-transporting layer and matrix for emitting substances. The second structural formula shows Ir(ac) (iridium(III)bis(2-methyldibenzo-[f,h]quinoxaline)(acetylacetonate)). The Ir-complex can be used for example as a red phosphorescent dye in an OLED. The third structural formula shows TPBI (1,3,5-tris(1-phenyl-1H-benzimidazole-2-yl)benzene), the organic compound III. This compound can be used inter alia for the hole-blocking layer and for the electron-conducting layer 3.

Figure 4:
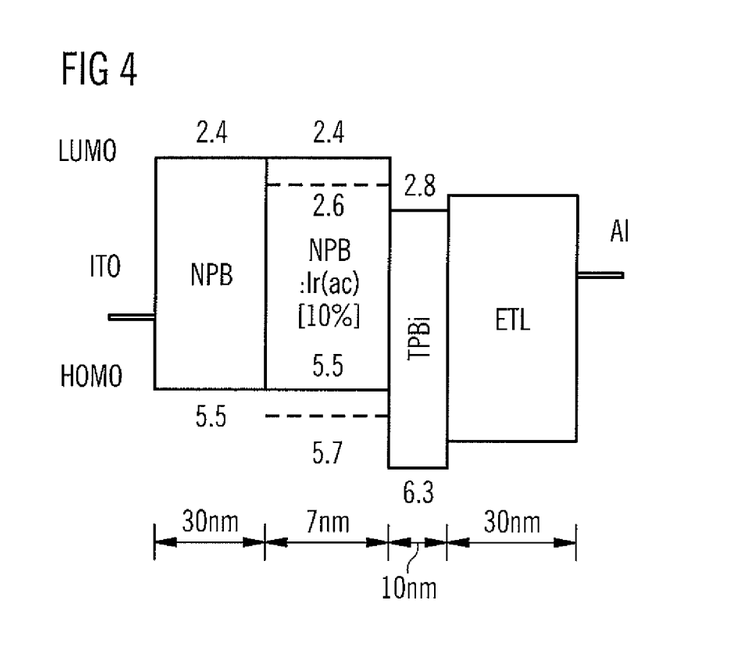
FIG. 4 shows the energy levels in an embodiment of an optoelectronic component.

FIG. 4 schematically illustrates the energy levels of the individual layers of an embodiment of a device in accordance with the invention which is formed as an OLED. The LUMOs and HOMOs of the individual layers are each specified, but also the layer thicknesses of the individual layers are specified. The transparent anode which is manufactured from ITO is followed by a 30 nm thick layer of NPB. This first layer of NPB which assumes the function of hole transport is followed by a further layer in which NPB serves as a matrix material. This second layer of NPB is 7 nm thick and additionally comprises a proportion of 10 mol % iridium(III)bis(2-methyldibenzo-[f,h]quinoxaline)(acetylacetonate) (Ir(ac)) whose structural formula is shown in FIG. 3. Both the LUMO and also the HOMO of the phosphorescent substance Ir(ac) lie just under the corresponding energy levels of the matrix material NPD. The emitting layer is followed by a 10 nm thick layer of TPBI, the organic compound III. This layer has a hole-blocking function. The energy levels of TPBI lie each under the corresponding energy levels of the phosphorescent substance. The hole-blocking layer is followed by the electron-conducting layer (ETL). This layer has a layer thickness of 30 nm in this embodiment. In the embodiments in accordance with the invention, the electron-conducting layer comprises a metal complex and an organic compound. This electron-conducting layer can be obtained by joint vaporization of the metal complex with the organic compound. In this embodiment, the electron-conducting layer assumes the function of the electron-injecting layer and also of the electron-transporting layer. The energy levels of the electron-conducting layer lie above the corresponding energy levels of the hole-blocking layer. The electron-conducting layer is followed by a cathode of Al. If voltage is applied to the anode and the cathode, then holes are induced by the anode into the hole-transporting layer and electrons are induced by the cathode into the electron-transporting layer. The positive charge carriers, the "holes", and the electrons migrate from there into the NPB-layer which is doped with the phosphorescent substance. When the holes and electrons recombine on the red emitter, excitons are generated which can excite the phosphorescent substance to give emission.

In the following FIGS. 5 to 8, measurement curves both of embodiments according to the invention with a metal complex in the ETL and also of non-inventive variants without a metal complex in the ETL are shown. Here, the ETL is varied in each case.

Figure 5:
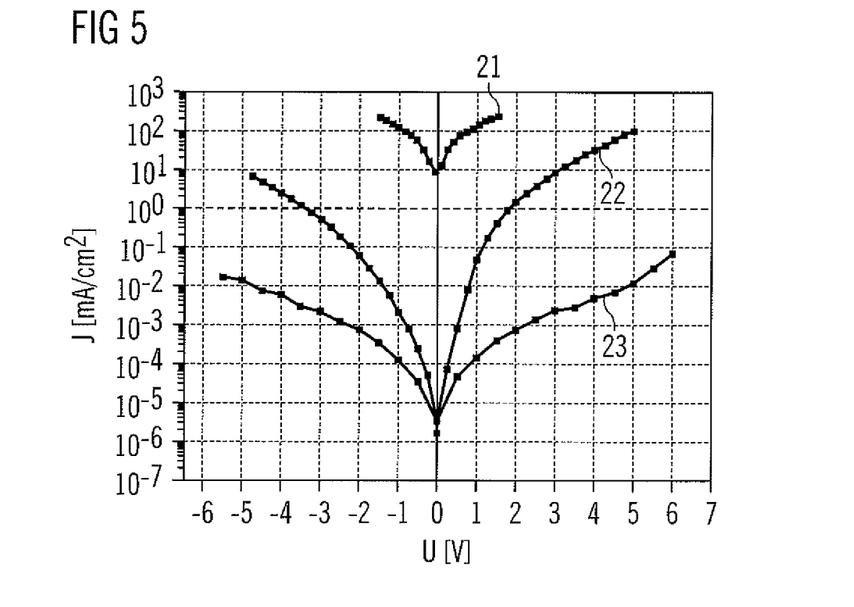
FIG. 5 shows three measurement curves of an embodiment of an OLED, in which current density is plotted against voltage.

FIG. 5 shows three measurement curves (21, 22, 23) in which the current density J is plotted against the voltage U. For these measurement curves, three OLED components were each manufactured from a 120 nm thick indium tin oxide electrode followed by a 150 nm thick electron-conducting layer, on which a 150 nm thick Al electrode is arranged. For this measurement, the same organic compound, namely the organic compound of the structure V, was used for the electron-conducting layers 3 of the three components in all three measurements. In case of the measurement curve 21, a proportion of 10 mol % of $W_2(TBD-A)_4$ is present as metal complex in the organic compound V. In case of the measurement curve 22, the proportion of $W_2(TBD-A)_4$ as metal complex is only 1 mol %. The measurement curve 23 was produced with the pure organic compound V, which means without a metal complex. The graph illustrated in FIG. 5 shows that, even with a proportion of 1 mol % (measurement curve 22) of the metal complex, very good current densities can be achieved at higher voltages. Even at a low voltage, the current densities achieved with 1 mol % of the metal complex (measurement curve 22) are already considerably better than the current densities which are achieved with the pure organic compound (measurement curve 23). The current densities which are achieved in the measurement curve 21 with the 10 mol % content of $W_2(TBD-A)_4$ are, over the entire measurement range, considerably higher than the corresponding values of the other two measurement curves 22 and 23 at the same voltage.

FIG. 5 hereby clearly shows the influence of the metal complex upon the current density. The "free" electrons additionally provided by the metal complex can thus make a decisive contribution to electron transport in the OLED component.

Figure 6:
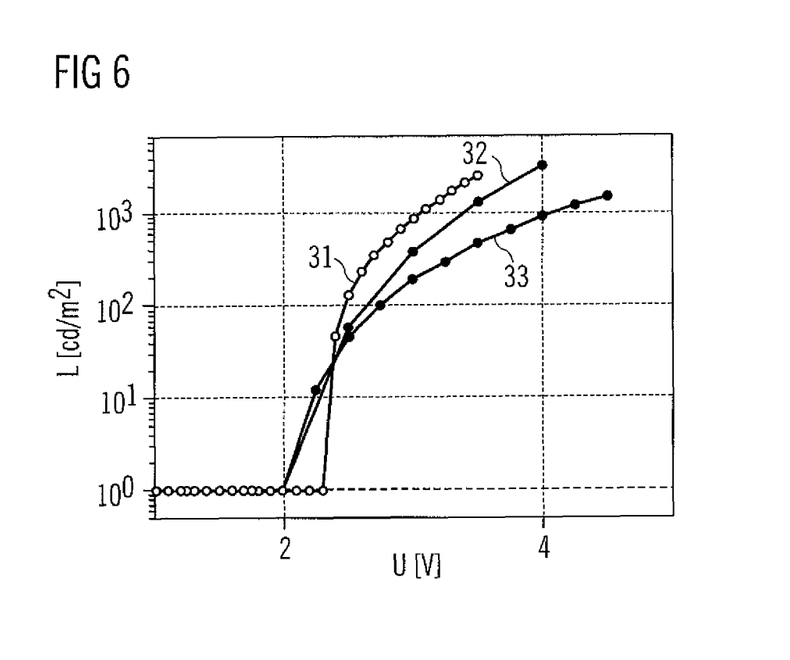
FIG. 6 shows three measurement curves of an embodiment of an OLED, in which luminescence is plotted against voltage.

FIG. 6 shows three measurement curves (31, 32, 33) in which the luminescence L is plotted against the voltage U. For the three measurement curves, three components were manufactured whose structure corresponds to the structure as described in the remarks to FIG. 4. For the three different measurement curves, the material for the electron-conducting layer was varied in each case. For the measurement curve 31, an electron-conducting layer of the organic compound II with a proportion of 10 mol % of $W_2(TBD-A)_4$ was used. For the measurement curve 32, an electron-conducting layer of the organic compound I with a proportion of 10 mol % of $W_2(TBD-A)_4$ was used. For the measurement curve 33, a component was used having an electron-conducting layer of the organic compound I and having an additional layer of LiF with a thickness of 0.7 nm between the electron-conducting layer and the Al electrode. Therefore, in the measurement curve 33, there is no metal complex in the electron-conducting layer. It is clearly evident from FIG. 6 that in the measurement curves 31 and 32, that is, the measurement curves in which 10 mol % of the metal complex are each present in the electron-conducting layer, better luminescences are achieved than with the electron-conducting layer which consists only of the pure organic compound. In this test arrangement, better values were achieved with the organic compound II than with the organic compound I. It is clearly evident from FIG. 6 that the metal complex has a positive effect on the luminescence, which is apparent from the direct comparison of the measurement curves 32 and 33.

Figure 7:
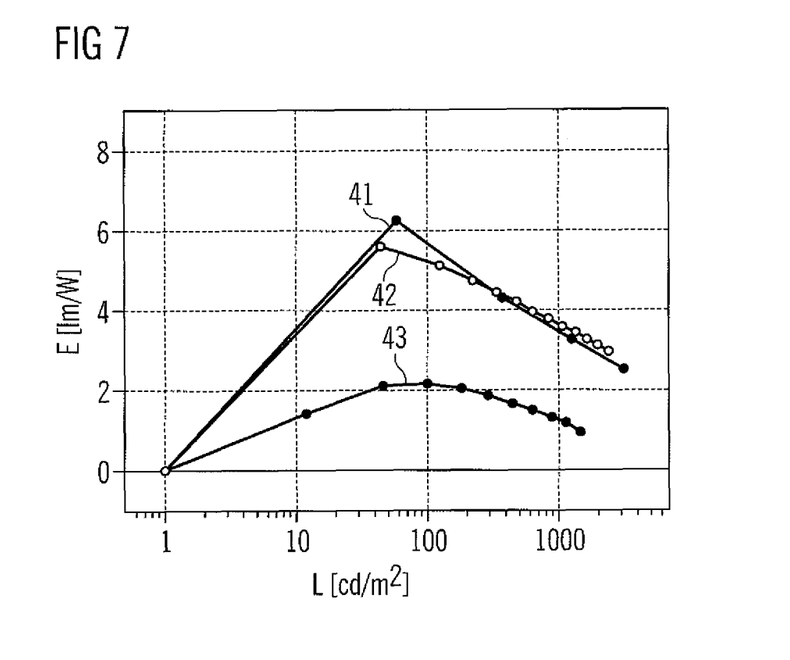
FIG. 7 shows three measurement curves of an embodiment of an OLED, in which radiation efficiency is plotted against luminescence.

FIG. 7 shows three measurement curves (41, 42, 43) in which the radiation efficiency E is plotted against the luminescence L. The structure of the components which were used for these measurement curves corresponds to the structure as described in the remarks to FIG. 4. The materials of the electron-conducting layer have been varied from measurement curve to measurement curve. In the measurement curve 41, a component was used having an electron-conducting layer of the organic compound I with a proportion of 10 mol % of $W_2(TBD-A)_4$. In the measurement curve 42, a component was used having an electron-conducting layer of the organic compound II with a proportion of 10 mol % of $W_2(TBD-A)_4$. The measurement curve 43 shows the results of the measurement of a component using the organic compound I, but without any metal complex. Between the electron-conducting layer and the Al electrode, the component of the measurement curve 43 additionally comprises a layer of LiF with a thickness of 0.7 nm. As it is clearly apparent form in FIG. 7, the measurement curves 41 and 42, in which the electron-conducting layer additionally each comprises a content of 10 mol % of the metal complex along with the organic compound, have a considerably improved level of efficiency compared to the measurement curve 43 with the electron-conducting layer which does not comprise any metal complex. Therefore, it is clearly apparent from the measurement values in FIG. 7 that the efficiency of the component can be increased considerably by the metal complex which has been vaporized together with the organic compound.

Figure 8:
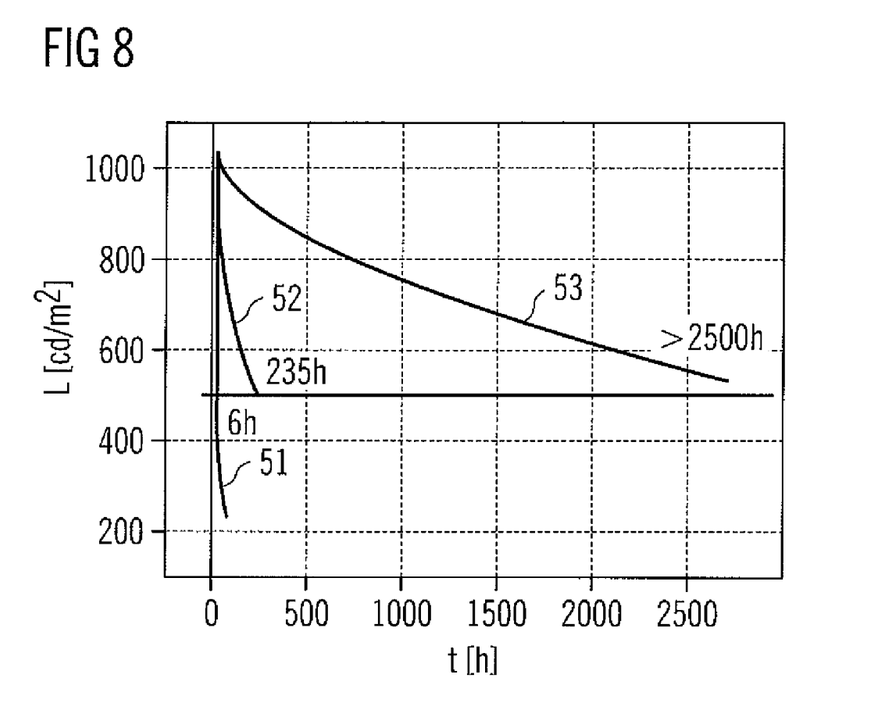
FIG. 8 shows three measurement curves of an embodiment of an OLED, in which luminescence is plotted against time.

FIG. 8 shows three measurement curves (51, 52, 53) in which the luminescence L is plotted against the time t. The "lifetime" is defined as 50% value of the originally adjusted brightness, in this case 1000 cd/m². If a component deceeds a threshold value of 500 cd/m², then it is considered to be no longer usable, its "lifetime" is considered to be expired. For the measurement curves, components were used in each case whose structure corresponds to the structure as described in the figure description of FIG. 4. For the three measurement curves, the electron-conducting layer was varied in each case. In the measurement curve 51, a component was used in which the electron-conducting layer consists only of the organic compound I. Between the electron-conducting layer and the Al electrode, the component additionally comprises a further layer of LiF with a thickness of 0.7 nm. In the measurement curve 52, an electron-conducting layer of the organic compound I with a proportion of 10 mol % of $W_2(TBD-A)_4$ was used. In the measurement curve 52, a component was used having an electron-conducting layer of the organic compound II with a proportion of 10 mol % of $W_2(TBD-A)_4$. FIG. 8 shows clearly that in the two measurement curves 52 and 53, in which the electron-conducting layer comprises a metal complex, considerably better lifetimes were achieved than in the measurement curve 51, in which the electron-conducting layer does not comprise any metal complex. In the case of this measurement, again, considerably better lifetimes (>2500 h) could be achieved in the measurement curve 53 with the organic compound II than in the measurement curve 52 with the organic compound I (235 h).

The measurement curves shown in FIGS. 5 to 8 show each clearly that the presence of the metal complex, which was vaporized together with the organic compound to form an electron-conducting layer, has a positive influence on the respective electric and optoelectronic parameters that was each measured. In the corresponding organic electronic components, it was possible to achieve a higher current density, higher luminescence, better efficiency and a longer lifetime by the joint vaporization of the metal complex with the organic compound.

Figure 9:
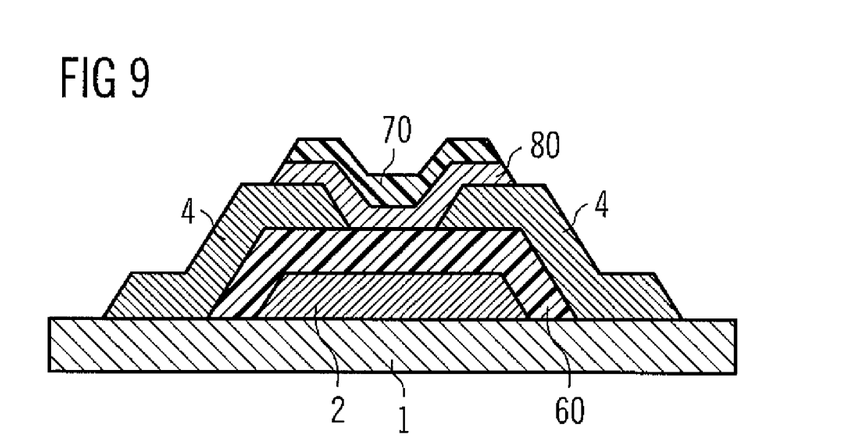
FIG. 9 shows a schematic side view of an embodiment which is formed as an organic field effect transistor.

FIG. 9 shows a schematic side view of an embodiment of a device in accordance with the invention which is formed as an organic field effect transistor (OFET). Arranged on the substrate 1 is the first electrode 2 which is formed as a gate electrode layer. The first electrode 2 is followed by an insulator layer 60 which can comprise for example a dielectric. The second electrode 4 is formed as source-drain contact layers and comprises an electron-conducting layer. Between the source and drain contact layer, a semiconductor 80 is arranged which consists of a hole-conducting material. The organic field effect transistor further comprises a cover layer 70 which can serve for example as encapsulation.

The invention is not restricted by the description on the basis of exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An organic electronic component, comprising:
   a substrate,
   a first electrode,
   a second electrode,
   an electron-conducting layer which is arranged in such a way that it is electrically conductively connected to at least one of the electrodes,
   wherein the electron-conducting layer is obtained by joint vaporization of a metal complex, which comprises a central metal atom, with an organic compound, wherein the organic compound comprises a heteroaromatic compound which is conjugated with an aromatic compound via a C—C bond.

2. The organic electronic component according to claim 1, wherein the organic compound coordinates to the metal complex due to the joint vaporization.

3. The organic electronic component according to claim 1, wherein the metal complex comprises more than one central metal atom.

4. The organic electronic component according to claim 1, wherein the central metal atom or central metal atoms is/are selected from Cr, Mo or W.

5. The organic electronic component according to claim 1, wherein the organic compound has the general formula:

wherein
the ring members A to F independently of each other represent C or one or two ring members can be N,
n is 2 to 8, wherein the free valences of the ends can be in each case independently of each other saturated by H, methyl, phenyl, 2-pyridyl, 3-pyridyl or 4-pyridyl,
$R^1$ to $R^4$ can be in each case independently of each other H, methyl, phenyl, 2-pyridyl, 3-pyridyl or 4-pyridyl and/or $R^1$ and $R^2$ or $R^3$ and $R^4$ can be connected together by butadiene or azabutadiene units, and can be connected between the nth and (n+1)th ring by ethylene or azomethine units, whereupon phenanthrene or aza-phenanthrene units are formed.

6. The organic electronic component according to claim 1, wherein the organic compound is selected from:

I

II

III

IV

-continued

V

VI

VII

VIII

IX

X

XI

XII

XIII

7. The organic electronic component according to claim 1, wherein the organic compound is selected from:

8. The organic electronic component according to claim 1, wherein at least parts of the organic compounds bridge two metal complexes together, so that a chain-like structure of the metal complexes is formed and/or at least parts of the organic compounds bridge more than two metal complexes together, so that a network-like structure of the metal complexes is formed.

9. The organic electronic component according to claim 1, which is formed as an organic LED (OLED) which additionally comprises an organic emitting layer.

10. A method for manufacturing an organic electronic component, comprising the method steps of:
   A) providing a substrate,
   B) applying a first electrode,
   C) depositing an electron-conducting layer on the substrate,
   D) applying a second electrode,
   wherein the electron-conducting layer is deposited by means of simultaneous vaporization of a metal complex and an organic compound, wherein the organic compound comprises a heteroaromatic compound which is conjugated with an aromatic compound via a C—C bond.

11. The method according to claim 10, wherein during the simultaneous vaporization the organic compound coordinates in the gas phase to the metal complex.

12. The method according to claim 10, wherein the electron-conducting layer is deposited as a chain-like or network-like structure.

13. The method according to claim 12, wherein the degree of cross-linking of the electron-conducting layer is controlled by the ratio between the metal complex and the organic compound during vaporization.

14. The method according to claim 10, wherein the organic compound does not coordinate to the metal complex prior to vaporization.

* * * * *